(12) United States Patent
Wu et al.

(10) Patent No.: US 10,869,393 B2
(45) Date of Patent: Dec. 15, 2020

(54) PEDESTAL MOUNTING OF SENSOR SYSTEM

(71) Applicant: Microsoft Technology Licensing, LLC, Redmond, WA (US)

(72) Inventors: Yinan Wu, Bellevue, WA (US); Michael S. Sutton, Arvada, CO (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/754,439

(22) Filed: Jun. 29, 2015

(65) Prior Publication Data

US 2016/0381798 A1 Dec. 29, 2016

(51) Int. Cl.
*H05K 1/18* (2006.01)
*G01P 1/02* (2006.01)
*G01C 19/5783* (2012.01)
*G01D 11/30* (2006.01)
*H05K 3/30* (2006.01)

(52) U.S. Cl.
CPC .......... *H05K 1/18* (2013.01); *G01C 19/5783* (2013.01); *G01D 11/30* (2013.01); *G01P 1/023* (2013.01); *H05K 3/301* (2013.01)

(58) Field of Classification Search
CPC ... H01L 23/5386; H01L 27/4618; H05K 1/11; H05K 1/14; H05K 1/141–144; H05K 1/18; H05K 1/181–187
USPC .......... 361/770–784, 760–764, 803
See application file for complete search history.

(56) References Cited

U.S. PATENT DOCUMENTS

| | | | |
|---|---|---|---|
| 5,051,870 A | 9/1991 | Companion | |
| 5,343,748 A | 9/1994 | Mozgowiec et al. | |
| 5,345,823 A | 9/1994 | Reidemeister et al. | |
| 5,901,046 A * | 5/1999 | Ohta | H05K 3/3442 174/250 |
| 6,278,264 B1 * | 8/2001 | Burstein | H01L 23/5386 257/700 |
| 6,398,252 B1 * | 6/2002 | Ishikawa | B60R 16/0239 280/727 |
| 6,412,346 B2 | 7/2002 | Barkai et al. | |

(Continued)

FOREIGN PATENT DOCUMENTS

| | | |
|---|---|---|
| EP | 0523862 A1 | 1/1993 |
| EP | 0675363 A2 | 10/1995 |

(Continued)

OTHER PUBLICATIONS

ISA European Patent Office, International Search Report and Written Opinion Issued in PCT Application No. PCT/US2016/037465, dated Sep. 13, 2016, WIPO, 11 Pages.

(Continued)

*Primary Examiner* — Tuan T Dinh
(74) *Attorney, Agent, or Firm* — Alleman Hall Creasman & Tuttle LLP

(57) ABSTRACT

Examples related to the incorporation of a sensor into an electronic device are disclosed. One example provides a system including a circuit board comprising a first side and a second side opposite the first side, a sensor housed in a package bonded to the first side of the circuit board, and a mounting pedestal coupled to the circuit board on the second side at a location opposite the package, the mounting pedestal configured to be mounted to a surface in an electronic device.

11 Claims, 4 Drawing Sheets

(56) References Cited

U.S. PATENT DOCUMENTS

| | | |
|---|---|---|
| 6,474,159 B1 | 11/2002 | Foxlin et al. |
| 6,578,682 B2 | 6/2003 | Braman et al. |
| 6,859,751 B2 | 2/2005 | Cardarelli |
| 6,987,304 B2 | 1/2006 | DCamp et al. |
| 7,004,107 B1 | 2/2006 | Raoux et al. |
| 7,345,365 B2 | 3/2008 | Lee et al. |
| 7,529,154 B2 | 5/2009 | Cole et al. |
| 8,080,925 B2 | 12/2011 | Berger et al. |
| 8,110,917 B2 | 2/2012 | Hirose et al. |
| 8,183,077 B2 | 5/2012 | Vaganov et al. |
| 8,412,393 B2 | 4/2013 | Anderson et al. |
| 8,530,274 B2 | 9/2013 | Pagaila |
| 8,583,392 B2 | 11/2013 | Panagas |
| 8,766,099 B2 | 7/2014 | Yeates |
| 2007/0032951 A1* | 2/2007 | Tanenhaus ............ G01C 21/16 702/151 |
| 2007/0090475 A1 | 4/2007 | Karnick et al. |
| 2008/0002377 A1* | 1/2008 | Kamoshida .......... H05K 5/0052 361/752 |
| 2008/0197514 A1 | 8/2008 | Goida |
| 2009/0001553 A1* | 1/2009 | Pahl ...................... B81B 7/0064 257/704 |
| 2009/0218668 A1* | 9/2009 | Zhe .................... B81C 1/00301 257/680 |
| 2010/0052087 A1* | 3/2010 | McElrea ........... H01L 27/14618 257/433 |
| 2010/0271787 A1* | 10/2010 | Holzmann ........... B81B 7/0054 361/729 |
| 2011/0114840 A1* | 5/2011 | Yamazaki ................ G01J 5/04 250/338.1 |
| 2011/0139987 A1 | 6/2011 | Kromer |
| 2012/0049300 A1* | 3/2012 | Yamaguchi ........... G01L 19/147 257/417 |
| 2013/0124127 A1* | 5/2013 | Ahuja ................... G01C 25/00 702/86 |
| 2013/0249031 A1* | 9/2013 | Oganesian ........ H01L 27/14627 257/432 |
| 2014/0027612 A1* | 1/2014 | Oganesian ........ H01L 27/14625 250/208.1 |
| 2014/0035071 A1 | 2/2014 | Chen et al. |
| 2014/0045290 A1* | 2/2014 | Horimoto ............ H04R 19/005 438/51 |
| 2014/0063753 A1 | 3/2014 | Chino |
| 2014/0208823 A1 | 7/2014 | Trusov et al. |
| 2014/0217566 A1 | 8/2014 | Goida et al. |
| 2015/0153565 A1* | 6/2015 | Imai ..................... G02B 26/001 359/578 |
| 2016/0297671 A1* | 10/2016 | Pahl ..................... B81B 7/0048 |

FOREIGN PATENT DOCUMENTS

| | | |
|---|---|---|
| EP | 0908363 A2 | 4/1999 |
| FR | 2933567 A1 | 1/2010 |
| JP | 2001298277 A | 10/2001 |
| KR | 1020130049996 A | 5/2013 |
| WO | 200901614 A1 | 2/2009 |

OTHER PUBLICATIONS

ISA European Patent Office, International Search Report and Written Opinion Issued in PCT Application No. PCT/US2016/037466, dated Oct. 14, 2016, WIPO, 11 Pages.

Aizzuddin, et al., "Obtaining translation from a 6-DOF MEMS IMU—An Overview", In Proceedings of Asia-Pacific Conference on Applied Electromagnetics, Dec. 4, 2007, 5 pages.

Yoon, S. et al., "Analysis and wafer-level design of a high-order silicon vibration isolator for resonating MEMS devices," Journal of Micromechanics and Microengineering, vol. 21, No. 1, Dec. 22, 2010, 12 pages.

Markovsky, Igor et al., "Adhesive Joint System for Printed Circuit Boards," U.S. Appl. No. 14/754,413, filed Jun. 29, 2015, 41 pages.

* cited by examiner

PEDESTAL MOUNTING OF SENSOR SYSTEM

BACKGROUND

An electronic device may include various sensors to provide input for device functionalities. Examples include, but are not limited to, motion sensors such as accelerometers and gyroscopes incorporated into an inertial measurement unit (IMU) of the device.

SUMMARY

Examples related to the incorporation of a sensor into an electronic device are disclosed. One example provides a system including a circuit board comprising a first side and a second side opposite the first side, a sensor housed in a package bonded to the first side of the circuit board, and a mounting pedestal coupled to the circuit board on the second side at a location opposite the package, the mounting pedestal configured to be mounted to a surface in an electronic device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
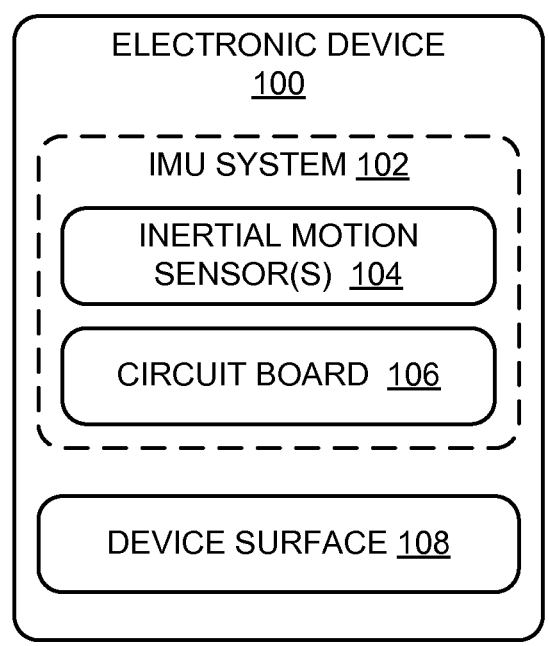
FIG. 1 shows an example electronic device including an inertial measurement unit (IMU).

Some sensors may be sensitive to movements arising from temperature-induced warpage of the materials to which the sensors are mounted. Temperature-induced warpage may arise, for example, from a mismatch between a coefficient of thermal expansion (CTE) of a circuit board and a sensor package mounted to the circuit board. Temperature fluctuations that can cause such warpage may arise from various sources. For example, the electronic device in which an IMU system is installed may be used in different ambient temperatures during normal usage. Also, heat dissipation inside the electronic device may cause additional temperature changes at various device usage/power conditions, even when the exterior ambient remains unchanged.

An IMU system thus may be calibrated to compensate for sensor position change as a function of temperature. Sensor calibration may be conveniently performed prior to placing the IMU system in an electronic device. However, a calibration performed prior to installation in an electronic device may not properly compensate for the temperature dependence of the sensors mounted in the device, as the temperature dependence of the sensors may change. For example, once mounted within an electronic device, the board may warp differently, or not at all, depending upon how the circuit board is mounted to the device.

Accordingly, examples are disclosed herein that may help to mitigate issues arising from the mounting of a pre-calibrated sensor system into another device. Briefly, a sensor system includes a mounting pedestal coupled to a printed circuit board of the sensor system on an opposite side of the circuit board as a sensor package. The mounting pedestal is coupled to the circuit board prior to calibration, and impacts the thermal warpage of the printed circuit board similarly both before and after installation into an electronic device. The sensor system may be installed in the device by fixing the mounting pedestal to a surface within the device, thereby allowing the sensor system to be mounted without adhering the circuit board directly to the surface within the device. This isolates the sensor circuit board from the CTE of the mounting surface in the electronic device. In some examples, the mounting pedestal may be similar in size, shape, and material properties to a sensor mounting package, and may be mounted to the circuit board directly opposite the sensor mounting package. Such a pedestal may negate the warpage arising from the CTE mismatch of the sensor package and circuit board. Each of these features helps to mitigate the effect on a previously performed calibration of installation into an electronic device.

The configuration described herein may be used to mount any suitable sensor or sensors within an electronic device, and is particularly suited for sensors that may be sensitive to intrinsic stresses and that undergo temperature calibration. Example sensors include but are not limited to inertial motion sensors, pressure sensors, image sensors, resonators, filters, and other types of sensors. While the below examples are described with respect to an IMU system having one or more inertial motion sensors, it is to be understood that other sensors could be used without departing from the scope of the disclosure.

An IMU system may be incorporated into any suitable electronic device. Examples include, but are not limited to, wearable computing devices such as head-mounted displays, other wearable computers, mobile devices, tablet computers, laptop computers, automobiles, unmanned aerial vehicles (UAVs), aircraft navigation systems, and attitude and heading reference systems (AHRS). FIG. 1 shows a block diagram of an example of an electronic device 100 that includes an IMU system 102 having one or more inertial motion sensors 104 coupled to an IMU circuit board 106. The IMU system 102 is mounted to a surface 108 of the electronic device 100, such as another circuit board within the electronic device.

The IMU system 102 is configured to output data used to determine a position and/or orientation of the electronic device 100, and may include at least three rate axes and three linear acceleration axes. In another example, the IMU system 102 may be configured as a six-axis or six-degree of freedom position sensor system. Such a configuration may include three accelerometers and three gyroscopes to indicate or measure a change in location of the electronic device 100 and a change in device orientation.

The electronic device 100 may include a logic machine and a storage machine. In one example, the storage machine may include instructions that are executable by the logic machine to adjust one or more parameters of the electronic device based on output from the IMU system 102. The IMU system 102 may be calibrated prior to placement in the electronic device to quantify a temperature dependence of the IMU system. Via calibration, the displacement of the IMU sensors that occur as temperature changes may be determined and used to correct output from the IMU when the IMU is placed in the electronic device.

Figure 2A:
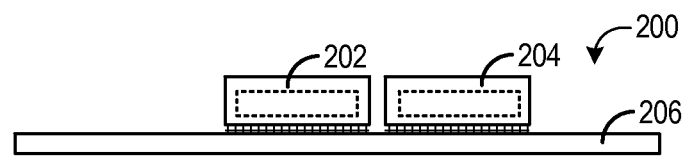
FIG. 2A-B schematically show an example IMU system during thermal calibration.
Figure 2B:
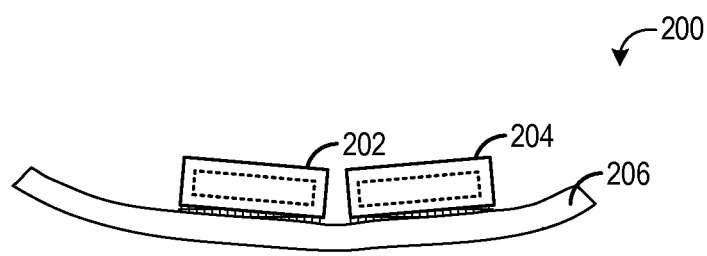
Figure 3:
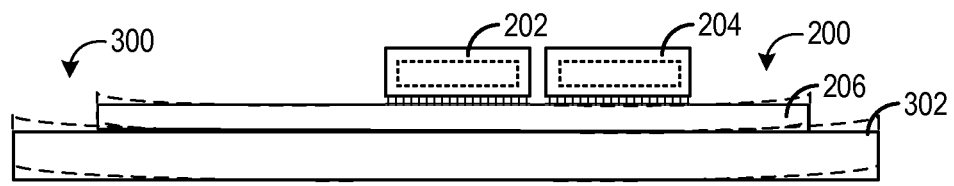
FIG. 3 schematically shows the example IMU system of FIGS. 2A-B mounted in an electronic device.

However, as mentioned above, the displacement caused by material warpage may differ when the IMU is mounted outside of the device relative to when the IMU is mounted in the device. FIGS. 2A-B and 3 illustrate this effect. Referring first to FIG. 2A, an example IMU system 200 without a mounting pedestal is illustrated. The IMU system 200 includes a first package 202 housing one or more inertial motion sensors and a second package 204 housing one or more inertial motion sensors. The first package 202 and second package 204 are mounted to an IMU circuit board 206.

During calibration, the IMU system 200 may be exposed to a range of temperatures. As the temperature increases, the IMU circuit board 206 may begin to warp from a relatively straighter configuration (FIG. 2A) to a more curved configuration (FIG. 2B) due to CTE mismatch between the IMU circuit board 206 and the first package 202 and second package 204 mounted to it. As illustrated, the first package 202 and the second package 204 may each change position (via rotation and/or displacement) as the IMU circuit board warps, which can affect the output of the IMU. It will be understood that warpage may be shown in exaggerated form in the Figures herein for clarity.

FIG. 3 schematically illustrates the IMU system 200 mounted in an electronic device 300. The IMU system 200 is directly mounted to a surface 302 of the electronic device 300 via an adhesive (e.g. an epoxy adhesive, solder, etc.). As the bonding of the IMU circuit board to the surface 302 restricts warping of the IMU circuit board 206 in the depicted example, a lesser degree of warpage (dashed lines) of the IMU circuit board 206 occurs at a comparable temperature as that of FIG. 2. It will be noted that, depending upon the material of surface 302, thermal expansion behavior of surface 302 may affect the warpage of the IMU circuit board 206 in other ways.

Figure 4A:
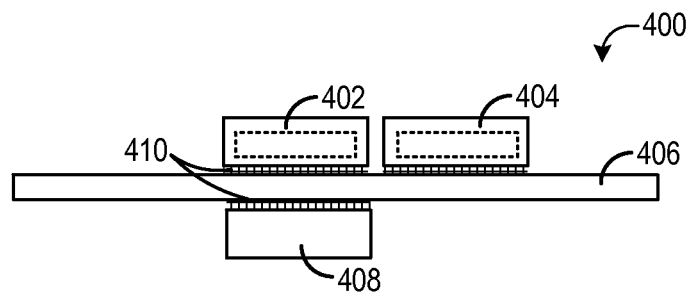
FIG. 4A-B show another example IMU system.
Figure 4B:
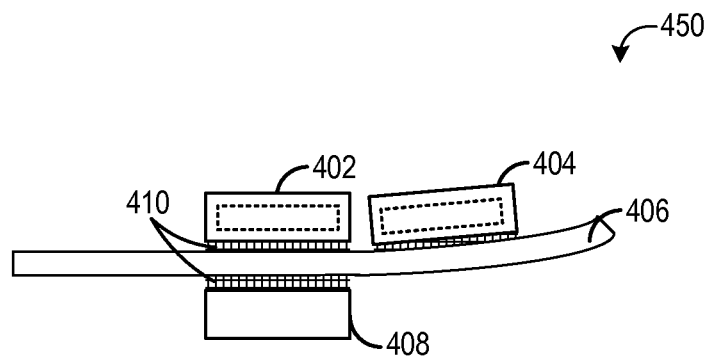
Figure 5:
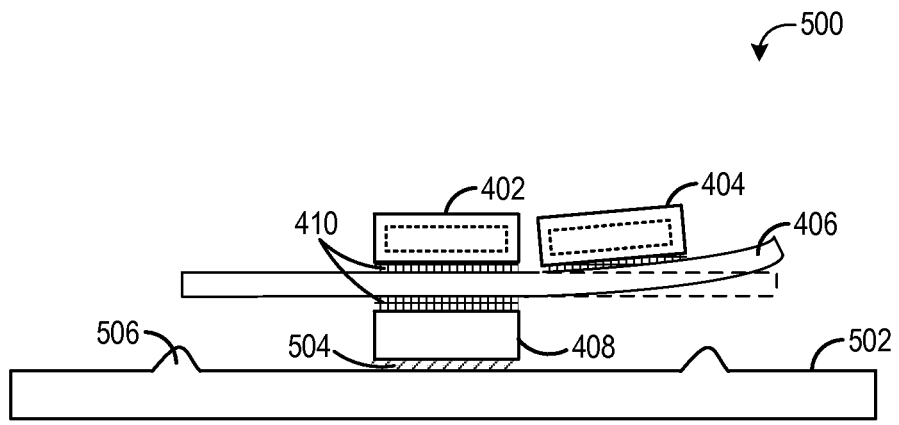
FIG. 5 shows the IMU system of FIG. 4A-B mounted in an electronic device.

In contrast, FIGS. 4A-B and 5 illustrate how an example mounting pedestal may help to maintain the accuracy of thermal calibration of the IMU system after installation into a device. First, FIG. 4A illustrates an IMU system including a first package 402 housing one or more first inertial motion sensors and a second package 404 housing one or more second inertial motion sensors. The first package 402 and second package 404 may each be formed from ceramic or other suitable material(s), which may include polymers, metals, composites, silicon wafer level chip scale packages, etc.

The first package 402 and second package 404 are mounted to a first side of an IMU circuit board 406. The IMU circuit board 406 may be formed from any suitable material or materials, and may be mounted to the IMU circuit board 406 via any suitable adhesive material, such as an epoxy adhesive, soldering, etc.

A mounting pedestal 408 is mounted to a second, opposite side of the IMU circuit board 406. The mounting pedestal 408 is mounted at a location directly opposite the first package 402, and may be similar in composition and configuration to the first package 402 in order to balance the effects of the first package on the expansion of the circuit board 406. As explained above, the presence of the first package 402 constrains the expansion of that surface of the circuit board 406. Thus, by placing a mounting pedestal similar in size, shape, and CTE to the first package on the bottom surface of the circuit board, a similar constraint may be imposed on the opposite circuit board surface, reducing warpage of the circuit board, as illustrated in FIG. 4B. It will be understood that some warpage may still occur due to the second package 404, but this warpage may be the same as when mounted outside of the electronic device (e.g. during device calibration) as when mounted within the electronic device.

The mounting pedestal 408 may be formed from a material having similar CTE to the first package 402. As one example, the mounting pedestal 408 is formed from the same material (e.g. a ceramic material) as the first package 402. In another example, the mounting pedestal 408 may be formed from a material having a CTE value that is the same or within a threshold similarity of a CTE value of the material of the first package 402. For example, the first package 402 may be formed from alumina, which has a CTE of 7.2 ppm/° C., and the mounting pedestal may be formed from a material with a similar CTE, such as cermet, which has a CTE of 7.4 ppm/° C. The threshold similarity may be have any suitable value, such as the two CTE values being within 5 or 10% of each other, and may be based upon any suitable factors, such a sensor error tolerance of an application using the sensor data. In still further examples, the mounting pedestal may be comprised of a material having a different CTE than the first package, provided the mounting pedestal allows for warpage that is sufficiently similar as when mounted outside of the electronic device (e.g. during device calibration) as when mounted within the electronic device.

As mentioned above, the mounting pedestal 408 may be similar in size and/or shape as the first package 402. In one example, the mounting pedestal 408 and first package 402 may have the same footprint (e.g. have mirror symmetry) and be disposed directly opposite one another on the IMU circuit board. In another example, the mounting pedestal 408 and first package 402 may be symmetric in three dimensions. In a further example, the mounting pedestal 408 and first package 402 may not be symmetric, but may have sufficiently similar thermal expansion characteristics to mitigate the calibration issues discussed above. Further, in some examples, the mounting pedestal may be sufficiently stiff to isolate thermal expansion mismatch between the IMU system and an electronic device in which it is mounted. Such thermal expansion mismatch may occur due to a CTE mismatch between the IMU circuit board and amounting surface of the electronic device.

In some examples, the mounting pedestal 408 may be coupled to the circuit board 406 using the same adhesive material 410 as the first package 402, such as solder, epoxy adhesive, or other suitable material. In other examples, the mounting pedestal 408 may be mounted to the circuit board with a different adhesive material than the first package 402. Further, while not shown in FIGS. 4A-B, in some examples a second mounting pedestal may be coupled to the circuit board directly opposite the second package 404 to mitigate warpage caused by the second package 404.

FIG. 5 schematically illustrates the IMU system 400 of FIG. 4 mounted in an electronic device 500. As illustrated, the IMU system 400 is mounted to a surface 502 of the electronic device 500 via the mounting pedestal 408. The surface 502 may be a circuit board of the electronic device 500, or may be any other suitable surface within the electronic device 500. The mounting pedestal 408 may be mounted to the surface 502 via any suitable adhesive material 504, such as a polymeric adhesive (e.g. an epoxy adhesive) or solder. The adhesive material 504 may be a same material or different material than adhesive material 410. The impact of the attachment method 504 on the curvature is reduced given the arrangement of the pedestal 408. FIG. 5 also shows that the warpage of the IMU circuit board 406 as installed in the device is substantially similar to that experienced during calibration (FIGS. 4A-B).

The isolation of the IMU circuit board warpage from the CTE mismatch between the IMU board and the attachment surface of the electronic device also could be achieved by using soft adhesives for the attachment, instead of or in addition to using a mounting pedestal. However, such an approach may create low-frequency resonance modes. As an example, the resonance frequency of the IMU circuit board after attachment to the electronic device can be as low as 200 Hz when a very soft adhesive is used. Such low frequency modes may affect the output of the IMU sensors. Therefore, a relatively stiff adhesive may be used for IMU system attachment to help avoid such low frequency modes.

Further, if the surface 502 in the electronic device is not sufficiently stiff, the surface 502 can induce low frequency resonance as well. As such, the surface 502 may be configured to be relatively stiff so that its first order natural frequency is above the resonance frequency of accelerometer and gyroscope MEMS (microelectromechanical system) sensors. As an example, the surface 502 is stiffened by adding ribs 506 over the surface 502 that effectively shift the first order frequency of the surface structure to a much higher frequency than the sensor resonance frequency, with little weight addition to the device. It will be understood that such ribs may be omitted, and/or other stiffening structures may be used.

Figure 6:
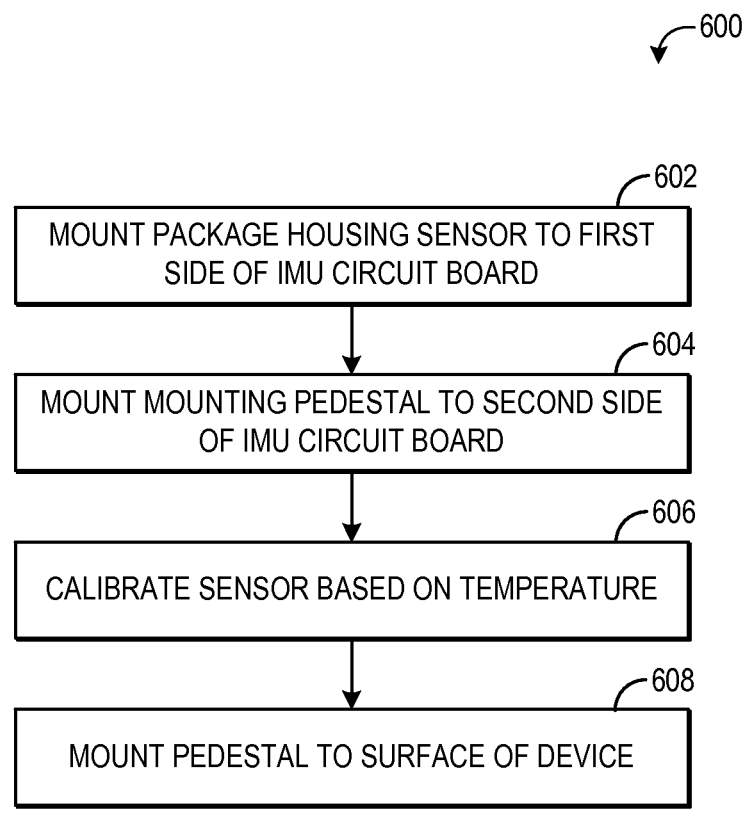
FIG. 6 is a flow chart illustrating an example method for assembling an electronic device including an IMU system.

FIG. 6 illustrates an example of a method 600 for assembling an electronic device including an IMU system. It will be understood that method 600 also may be used to assemble a device comprising any other position-sensitive pre-calibrated sensor than IMU sensors. At 602, method 600 includes mounting a package housing an inertial motion sensor to a first side of an IMU circuit board. As described above, the inertial motion sensor may comprise an accelerometer, a gyroscope, and/or any other suitable motion sensor(s).

At 604, method 600 includes fixing a mounting pedestal to a second side of the IMU circuit board. The mounting pedestal may be formed from a material having the same or similar CTE as the package housing, and may have a shape (e.g. footprint on the circuit board, or full three-dimensional shape) that is similar or symmetric to the package housing. The pedestal may be mounted to the circuit board directly opposite to the MEMS package, or at any other suitable location. Once the ceramic pedestal is mounted to the IMU circuit board, a temperature dependence of the IMU unit is calibrated at 606, to capture the effects of temperature-induced warpage.

At 608, the mounting pedestal is mounted to a surface of the electronic device. The electronic device may be any suitable electronic device, including but not limited to a head-mounted see-through display device, a mobile computing device such as a smartphone, or other portable electronic device. The pedestal may be mounted to the surface of the electronic device with any suitable adhesive. As mentioned above, the use of stiff adhesives may help to avoid the introduction of low frequency vibrational modes.

Another example provides a system including a circuit board comprising a first side and a second side opposite the first side; a sensor housed in a package bonded to the first side of the circuit board; and a mounting pedestal coupled to the circuit board on the second side at a location opposite the package, the mounting pedestal configured to be mounted to a surface in an electronic device. In such an example, the package alternatively or additionally may be formed from a first material and the mounting pedestal may be formed from a second material, the first and second materials each having a coefficient of thermal expansion value that is within a threshold similarity based upon a sensor error tolerance. In such an example the package alternatively or additionally may have a first footprint and the mounting pedestal may have a second footprint symmetric to the first footprint. In such an example, the mounting pedestal additionally alternatively may be coupled to the circuit board on the second side at a location directly opposite the package. The package alternatively or additionally may be soldered to the circuit board, and the mounting pedestal alternatively or additionally may be soldered to the circuit board. In such an example, the sensor alternatively or additionally may be a first inertial motion sensor, and a second inertial motion sensor may be coupled to the circuit board. In such an example, the first inertial motion sensor may additionally or alternatively includes a gyroscope, and the second inertial motion sensor may alternatively or additionally include an accelerometer. Any or all of the above-described examples may be combined in any suitable manner in various implementations.

Another example provides an electronic device comprises a surface; and an inertial measurement unit (IMU) system coupled to the surface, the IMU system comprising an IMU circuit board comprising a first side and a second side opposite the first side; an inertial motion sensor housed in a package bonded to the first side of the IMU circuit board; and a mounting pedestal coupled to the IMU circuit board on the second side at a location directly opposite the package, the mounting pedestal mounted to the surface. in such an example, the surface may additionally or alternatively includes a surface of a circuit board within the device. In such an example, the package and the mounting pedestal may additionally or alternatively include a same coefficient of thermal expansion. in such an example. The package and the pedestal may additionally or alternatively comprise a same material. in such an example, the package may additionally or alternatively have a first footprint and the mounting pedestal may have a second footprint symmetric to the first footprint. in such an example, the inertial motion sensor may additionally or alternatively be a first inertial motion sensor, and a second inertial motion sensor may be coupled to the IMU circuit board. in such an example, the first inertial motion sensor may additionally or alternatively be a gyroscope, and the second inertial motion sensor may be an accelerometer. In such an example, the mounting pedestal may be mounted to the surface via an epoxy adhesive. Any or all of the above-described examples may be combined in any suitable manner in various implementations.

An example provides a method for assembling an electronic device comprising an inertial measurement unit (IMU) system. The example method comprises mounting the IMU system to a surface of the electronic device, the IMU system comprising a package housing an inertial motion sensor, an IMU circuit board having a first side and a second side opposite the first side, and a mounting pedestal, the package mounted to the first side of the IMU circuit board and the mounting pedestal mounted to the second side of the IMU circuit board directly opposite the package. In such an example, mounting the IMU system to the surface of the electronic device may additionally or alternatively comprise mounting the mounting pedestal to the surface of the electronic device. In such an example, mounting the mounting pedestal to the surface of the electronic device may additionally or alternatively include mounting the mounting pedestal to the surface of the electronic device via an epoxy adhesive. Such an example additionally or alternatively may comprise calibrating output from the inertial motion sensor as a function of IMU system temperature. in such an example, the package may have a first footprint, and wherein the mounting pedestal may have a second footprint that is symmetric to the first footprint. Any or all of the above-described examples may be combined in any suitable manner in various implementations.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A system comprising:
a sensor circuit board comprising a first side and a second side opposite the first side;
an inertial motion sensor housed in a package bonded to the first side of the sensor circuit board, the inertial motion sensor being pre-calibrated to capture changes in a position of the inertial motion sensor due to temperature-induced warpage of the sensor circuit board; and
a mounting pedestal coupled to the circuit board on the second side at a location opposite the package, the mounting pedestal mounted to another circuit board via one or more of an epoxy adhesive, another adhesive, or a solder in an electronic device,
wherein the package is formed from a first material and the mounting pedestal is formed from a second material, the first and second materials each having a coefficient of thermal expansion value that is within a threshold similarity based upon a sensor error tolerance.

2. The system of claim 1, wherein the package has a first footprint and the mounting pedestal has a second footprint symmetric to the first footprint.

3. The system of claim 1, wherein the mounting pedestal is coupled to the sensor circuit board on the second side at a location directly opposite the package.

4. The system of claim 1, wherein the package is soldered to the sensor circuit board, and wherein the mounting pedestal is soldered to the sensor circuit board.

5. The system of claim 1, wherein the sensor is a first inertial motion sensor, and further comprising a second inertial motion sensor coupled to the sensor circuit board.

6. The system of claim 5, wherein the first inertial motion sensor is a gyroscope, and wherein the second inertial motion sensor is an accelerometer.

7. An electronic device, comprising:
a first circuit board; and
an inertial measurement unit (IMU) system coupled to the first circuit board, the IMU system comprising
an IMU circuit board comprising a first side and a second side opposite the first side;
an inertial motion sensor housed in a package bonded to the first side of the IMU circuit board, the inertial motion sensor being pre-calibrated for changes in temperature, the package having a first footprint; and
a mounting pedestal coupled to the IMU circuit board on the second side at a location directly opposite the package, the mounting pedestal mounted to the first circuit board to couple the IMU system to the first circuit board, the mounting pedestal having a second footprint symmetric to the first footprint, the mounting pedestal and the package comprising a same coefficient of thermal expansion and a same material,
wherein the mounting pedestal is mounted to the first circuit board via one or more of an epoxy adhesive, another adhesive, and a solder.

8. The electronic device of claim 7, wherein the inertial motion sensor is a first inertial motion sensor, and further comprising a second inertial motion sensor coupled to the IMU circuit board.

9. The electronic device of claim 8, wherein first inertial motion sensor is a gyroscope, and wherein the second inertial motion sensor is an accelerometer.

10. A method for assembling an electronic device comprising an inertial measurement unit (IMU) system, the method comprising:
mounting the IMU system to a surface of the electronic device, the IMU system comprising a package housing an inertial motion sensor, the package having a first footprint, an IMU circuit board having a first side and a second side opposite the first side, and a mounting pedestal having a second footprint symmetric to the first footprint, the package mounted to the first side of the IMU circuit board and the mounting pedestal mounted to the second side of the IMU circuit board directly opposite the package, the mounting pedestal and the package comprising a same coefficient of thermal expansion and a same material,
wherein the mounting pedestal is mounted to the surface of the electronic device via one or more of an epoxy adhesive, another adhesive, or a solder.

11. The method of claim 10, further comprising calibrating output from the inertial motion sensor as a function of IMU system temperature.

* * * * *